United States Patent [19]

Davis

[11] 4,053,372
[45] Oct. 11, 1977

[54] TIN-LEAD ACIDIC PLATING BATH

[75] Inventor: Thomas Francis Davis, Harrisburg, Pa.

[73] Assignee: AMP Incorporated, Harrisburg, Pa.

[21] Appl. No.: 620,981

[22] Filed: Oct. 9, 1975

[51] Int. Cl.$^2$ .................... C25D 3/60; C09K 3/00
[52] U.S. Cl. ............................ 204/43 S; 252/182
[58] Field of Search ............. 204/43 S, 123; 252/182

[56] References Cited

U.S. PATENT DOCUMENTS

| | | | |
|---|---|---|---|
| 1,564,414 | 12/1925 | Hoff | 204/50 Y |
| 2,734,025 | 2/1956 | Roehl | 204/43 S |
| 3,769,182 | 10/1973 | Hsu | 204/43 S |
| 3,785,939 | 1/1974 | Hsu | 204/43 S |
| 3,793,161 | 2/1974 | Manko | 204/43 S |
| 3,926,749 | 12/1975 | Passal | 204/43 S |

OTHER PUBLICATIONS

Abner Brenner, "Electrodeposition, of Alloys," vol. II, p. 4, (1963).

*Primary Examiner*—G. L. Kaplan
*Attorney, Agent, or Firm*—Russell J. Egan

[57] ABSTRACT

A method for electroplating tin-lead compositions, a bath for electroplating of tin-lead alloys and stable, solid salt compositions for make up of a bath for plating the tin-lead alloys, said bath contains, besides the two metals, thiourea, potassium, hypophosphite and hydrochloric acid with the pH of the bath being from 0.5 to 1.5.

7 Claims, No Drawings

TIN-LEAD ACIDIC PLATING BATH

This invention relates to electroplating of metals; more specifically, this invention relates to electroplating of tin lead alloys as well as bath solutions which are used for depositing tin-lead alloys from the electrolyzed bath solution. Solid salt compositions useful for making the tin-lead containing bath solutions, for electrodepositing tin-lead alloys therefrom, are within the contemplation of the invention.

According to the invention, the novel bath deposits tin-lead alloys in an advantageous manner without requiring the use of fluorides or fluoroborates which are especially disadvantageous because of the bath effluent disposal problems associated with fluoride or fluoroborate containing baths. For example, the highly toxic fluorides must be eliminated from the effluent to about a concentration of 1 part per million.

BACKGROUND FOR THE INVENTION

In the electrodeposition of tin and lead many methods have been proposed which have, in general, evolved towards methods based on depositing these two metals as alloys from a bath which is known as fluoride or fluoroborate bath. Tin-lead alloys deposited from these baths provide the necessary advantages associated with these deposits.

Another problem for depositing tin and lead from these prior art baths has been the disadvantages associated with maintaining a consistent tin-lead proportion in the deposit as it is being plated from a bath solution. Thus, the prior art bath solutions have been dependent, with respect to the composition of the alloy deposit, not only on the current density (expressed in amperes per square feet, i.e., ASF), but also based on the temperature and concentration of each of the metal elements in the bath solution. Other baths have had a number of organic additives and thus have caused organic contaminant inclusion or occlusion, especially at the high deposit rates (in terms of ASF) sought to be used for economic operation of any plating line.

In addition to the prior art disadvantages arising from the changing alloy deposits, deposit contamination, and the stringent effluent treatment which is required, other disadvantages of the fluoride and fluoroborate bath are associated with fluoride or fluorine corrosion. Toxicity of the components in the prior art fluoride or fluoroborate bath is also a problem. The various shortcomings of the prior art bath have thus prompted a search for the replacement bath having all the advantages but few, if any, disadvantages.

DESCRIPTION OF THE INVENTION AND THE PREFERRED EMBODIMENTS

It has now been found that an electroplating bath for tin-lead alloys based on a thiourea complex of tin and lead with sodium hypophosphite as a solubilizing agent provides many non-obvious and surprising advantages over the prior art tin-lead bath. For example, the new bath is substantially entirely independent of ASF and temperature and only concentration dependent when plating tin-lead alloys of various proportions.

As a result of the combination of elements, the present method provides for a substantially complete control of the tin-lead deposit over a wide range of current densities and temperatures thus almost being capable of being classified as a current density and temperature independent system. In addition, the system is substantially directly concentration related, that is, the concentration of the two dissolved metals in the bath in their dissolved proportions reflect the percent of both metals in the electrodeposit.

As a further advantage, the present bath can be operated over a wide current density range such as from 5 to 800 ASF. With respect to the upper range, generally the plating can be effected in the stripline such as by means of a belt plater, a tip, or a wheel plater, all associated with high localized and mechanical agitation.

In general, a tin to lead content of 93 percent tin balance lead, of 2 ounces per gallon of said metals in the solution in the indicated proportions can be deposited over a current range from 5 to 100 ASF; and a 60 percent tin, 40 percent lead content at 2 ounces total metals concentration in the bath solution can equally well be operated over a total range from 5 to 100 ASF.

With respect to the solid, salt compositions which are useful for formulating the bath, these can be compounded as storage stable solids when admixed with acidified water in the proportions further identified herein, the solution can be readily electrolyzed and used in a bath or incorporated in a bath as a make up to obtain a desired aqueous electrolyzable bath of the characteristics desired for depositing the alloys.

With respect to the composition which has been used in the bath, tin metal is generally used as a stannous chloride in an amount from 7.5 to 75 grams per liter based on elemental metal, a corresponding amount in ounces and gallons is from 1 to 10 ounces per gallon. Lead metal is added as lead chloride and it can be from 1 to 99 percent of the total in the concentration. The preferred alloy combinations are 93 percent tin, 7 percent lead because lead prevents the whisker growth of tin as it is being deposited on circuit elements such as printed circuits; another preferred concentration is 60 percent tin and 40 percent lead which is being used as an overplate to obtain solderability for printed circuit elements or for terminals.

With respect to the complexing agent, thiourea, and its substituted derivatives are useful. Of these, thiourea is vastly more preferred but compounds such as dimethyl thiourea or tetramethyl thiourea suggest themselves as other complexing agents.

For desirable stable maintenance, in solution, of the metal-complexing agent and to provide an electrolyzing medium, ammonium chloride is used. Ammonium chloride may be omitted, but when used is preferably used from 40 grams per liter (as a minimum, 50 grams per liter is a more convenient lower limit) up to 300 grams per liter of the solution. Further, 7 to 40 ounces per gallon is also a reasonable range for the ammonium chloride concentration in a bath solution.

As mentioned before, thiourea is the preferred complexing agent. It is used in an amount from 10 grams per liter of the solution to 200 grams per liter of the solution or on ounces per gallon basis from 1 to 30 ounces per gallon. As the solubilizing agent for the thiourea-tin complex, sodium hypophosphite ($NaH_2PO_2.H_2O$) is useful as the preferred species. Other hypophosphites which are useful are ammonium hypophosphite and potassium hypophosphite. The amount of hypophosphite used is from 10 to 200 grams per liter. A conventional range is from 30 to 100 grams. As a ready approximation, about 20 grams of hypophosphite per liter of total content in the bath may usefully be used to establish the amount needed. On a per ounce basis, the amounts of hypophosphite in the bath may be from 1 to 30 ounces per gallon.

With respect to the acid which is being used, it is conventionally hydrochloric acid and it is conventionally at a 36 percent concentration added in an amount from 30 milliliters to 100 milliliters per liter of the bath solution. A range of 20 milliliters to 150 milliliters per liter is a full range but excessive amounts of hydrochloric acid causes corrosion and therefore are not suggested.

The equipment may readily be a plastic tank. Operating temperature is from 130° to 200° F. As it is evident from the previous discussion, the concentration of the metals in the bath depends on the alloy composition desired and may range from 1 to 99 percent lead of the total metals in the bath solution. The pH of the bath is from 0.5 to 1.5 and the acid bath causes no change of the stannous chloride to the stannic species, i.e., the stannic species are not formed in the bath (i.e., oxidized) and the formation of stannous hydroxide by oxidation of the bath components is also substantially nonexistent. Agitation of the bath is also recommended but only mechanical agitation is suggested because the agitation by means of air (but not inert gases) may cause unwanted oxidation.

With respect to the high current density range, that is, above 100 ASF, the metal concentration which is suggested is, of course, higher such as 10 ounces per gallon. The high ASF or current densities can be most usefully employed only in stripline plating where the vigorous agitation is practiced such as when using belt platers or disc platers which bring a limited amount of solution into contact with the workpiece to be plated and immediately remove the solution from the plated area.

With respect to the other additives which are employed, it is evident that except for thiourea, no organic additives are being added and consequently at the high ASF decomposition of organic additives which generally cause an undesirable deposit is substantially nonexistent.

Although, in general, a surfactant such as a wetting agent may be added, for example, Igepal CO-970 (which is reputedly a nonyl phenoxy ethylene oxide adduct of 50 moles ethylene oxide per mole nonyl phenol and is available from GAF, Inc.) other useful surfactants may also be used or entirely eliminated at the high ASF conditions.

With respect to the following example, illustrative process conditions as well as representative operative conditions as shown, provide for electrodeposition of an alloy in the indicated proportions. The example is submitted merely to illustrate the invention and a specific embodiment and not to limit the invention.

EXAMPLE 1

Tin and lead in a proportion of 93 percent tin to 7 percent lead is obtained by using as a bath solution the following components:

| | |
|---|---|
| 15 g/l | Sn* (added as $SnCl_2 \cdot 2H_2O$) |
| 1.15 g/l | Pb* (added as $PbCl_2$) |
| 40 g/l | $NaH_2PO_2 \cdot H_2O$ |
| 50 ml/l | HCl |
| 40 g/l | $NH_4Cl$ |
| 0.5 g/l | Igepal CO-970 (GAF, Inc. surfactant) |
| 40 g/l | Thiourea |
| Operating Temperature | 60° C |
| Current Density | 30 ASF |
| Mechanical Agitation | |
| 93-7 Tin-Lead Anodes | |

At room temperature, if a precipitate appears in the bath, it can readily be removed by gently heating the bath solution and redissolving the precipitate.

The alloy composition can be maintained very well through the entire usable current density range. Throwing power is also extremely good, such as over phosphorous bronze and beryllium copper. In general, the deposits are best made over copper and copper alloys. A suitable device which has been plated is a terminal such as AMP-LEAF™ well known to those skilled in the art and available from AMP Inc., Harrisburg, Pennsylvania.

It has also been found that the deposits such as 93 to 7 percent lead deposit provides a low contact resistance. The inherent lubricity and wear are also very good. Inasmuch as very few organic additives are being added, the deposits are substantially inert.

What is claimed is:

1. A method for depositing tin-lead alloys from an aqueous electrolyte solution comprising electrolyzing a solution comprising from

| | |
|---|---|
| Sn metal (as stannous chloride) | 7.5-75 g/l |
| Pb metal (as lead chloride) | 1-99% of total Sn and Pb concentration |
| A thiourea | 10-200 g/l |
| $NH_4Cl$ | 00-300 g/l |
| $Na^+$, or $K^+$ with $-H_2PO_2 \cdot H_2O$ | 10-200 g/l |
| HCl, 36% concentrated | 20-500 ml/l | said solution being at a pH from 0.5 to 1.5, said bath being at a temperature from 130° to 200° F and depositing said lead alloy on a cathodic work piece and recovering said work piece.

2. A method for depositing a tin-lead alloy from an aqueous electrolyte solution as defined in claim 1 wherein the electrolyte comprises:

| | |
|---|---|
| Sn* (added as $SnCl_2 \cdot 2H_2O$) as metal | 15 g/l |
| Pb* (added as $PbCl_2$) as metal | 1.15 g/l |
| $NaH_2PO_2 \cdot H_2O$ | 40 g/l |
| HCl, 36% concentrated | 50 ml/l |
| $NH_4Cl$ | 40 g/l |
| a nonylphenoxy ethylene oxide adduct | 0.5 g/l |
| Thiourea | 40 g/l | said bath being at 60° C, the current density at about 5 to 30 ASF, and said bath being agitated mechanically.

3. The method as defined in claim 1 wherein the hypophosphite is potassium hypophosphite.

4. The method as defined in claim 1 wherein the hypophosphite is sodium hypophosphite.

5. A storage stable solids composition for use to make the electrolyte solution used in the method of claim 1 consisting essentially of tin metal as a stannous salt, lead metal as a lead salt, ammonium chloride, a thiourea, and a hypophosphite wherein said lead on an elemental basis is from 1 to 99 percent based on the amount of total metal in said composition.

6. The composition as defined in claim 5 wherein the same contains as a surfactant alkylphenoxy (ethylene oxide) adduct.

7. An aqueous electrolyte suitable for deposition of tin-lead alloys from said electrolyte, said aqueous electrolyte comprising

| | |
|---|---|
| Sn metal (as stannous chloride) | 7.5 - 75 g/l |
| Pb metal (as lead chloride) | 1 - 99 % of total |

| -continued | |
|---|---|
| Sn and Pb concentration | |
| A thiourea | 10 – 200 g/l |
| NH$_4$Cl | 0 – 300 g/l |

| -continued | |
|---|---|
| Na$^+$, NH$_4^+$ or K$^+$ with –H$_2$PO$_2$ . H$_2$O | 10 – 200 g/l |
| HCl (conc.) | 20 – 500 ml/l | wherein the pH of said solution is from 0.5 to 1.5.

* * * * *